United States Patent
Lim et al.

(10) Patent No.: US 8,482,327 B2
(45) Date of Patent: Jul. 9, 2013

(54) VOLTAGE-CONTROLLED DELAY LINES, DELAY-LOCKED LOOP CIRCUITS INCLUDING THE VOLTAGE-CONTROLLED DELAY LINES, AND MULTI-PHASE CLOCK GENERATORS USING THE VOLTAGE-CONTROLLED DELAY LINES

(75) Inventors: Jung-pil Lim, Uiwang-si (KR); Jae-youl Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 66 days.

(21) Appl. No.: 13/155,866

(22) Filed: Jun. 8, 2011

(65) Prior Publication Data
US 2011/0298510 A1 Dec. 8, 2011

(30) Foreign Application Priority Data
Jun. 8, 2010 (KR) .................. 10-2010-0054054

(51) Int. Cl.
*H03L 7/06* (2006.01)

(52) U.S. Cl.
USPC .......................................... 327/158; 327/147

(58) Field of Classification Search
USPC .................................................. 327/149, 158
See application file for complete search history.

(56) References Cited

U.S. PATENT DOCUMENTS

| | | | |
|---|---|---|---|
| 7,622,969 B2 * | 11/2009 | Johnson | 327/158 |
| 8,032,778 B2 * | 10/2011 | Lin | 713/500 |
| 2009/0116306 A1 * | 5/2009 | Song et al. | 365/189.09 |
| 2010/0033218 A1 * | 2/2010 | Kim | 327/158 |
| 2011/0234281 A1 * | 9/2011 | Kim | 327/158 |
| 2011/0285434 A1 * | 11/2011 | Shumarayev et al. | 327/156 |
| 2011/0298510 A1 * | 12/2011 | Lim et al. | 327/158 |
| 2012/0007646 A1 * | 1/2012 | Yun et al. | 327/158 |
| 2012/0019295 A1 * | 1/2012 | Lin | 327/157 |
| 2012/0081160 A1 * | 4/2012 | Choi et al. | 327/158 |
| 2012/0169388 A1 * | 7/2012 | Ma | 327/158 |
| 2012/0194231 A1 * | 8/2012 | Yun et al. | 327/147 |
| 2012/0249199 A1 * | 10/2012 | Chung | 327/158 |

FOREIGN PATENT DOCUMENTS

| | | |
|---|---|---|
| JP | 2009-010737 A | 1/2009 |
| KR | 10-0437539 B1 | 1/2003 |
| KR | 10-0808592 B1 | 1/2008 |

* cited by examiner

*Primary Examiner* — Adam Houston
(74) *Attorney, Agent, or Firm* — Harness, Dickey & Pierce, P.L.C.

(57) ABSTRACT

A delay-locked loop circuit includes a voltage-controlled delay line configured to generate a plurality of delayed clock signals based on an input clock signal, a lock signal and a voltage control signal, the plurality of delayed clock signals being sequentially delayed from one another to produce an earliest delayed clock signal to a latest delayed clock signal, the voltage-controlled delay line including an anti-jitter delay circuit and a plurality of delay circuits, the anti-jitter delay circuit configured to output the earliest delayed clock signal, and the plurality of delay circuits coupled in series and configured to output a remainder of the plurality of delayed clock signals, a phase frequency detection circuit configured to generate an up signal and a down signal based on the earliest delayed clock signal and the latest delayed clock signal, a filter configured to generate the voltage control signal in response to the up signal and the down signal, and a lock detection circuit configured to generate the lock signal in response to the up signal and the down signal.

16 Claims, 8 Drawing Sheets

VOLTAGE-CONTROLLED DELAY LINES, DELAY-LOCKED LOOP CIRCUITS INCLUDING THE VOLTAGE-CONTROLLED DELAY LINES, AND MULTI-PHASE CLOCK GENERATORS USING THE VOLTAGE-CONTROLLED DELAY LINES

CROSS-REFERENCE TO RELATED APPLICATIONS

This application claims priority under 35 U.S.C. §119 to Korean Patent Application No. 10-2010-0054054, filed on Jun. 8, 2010, in the Korean Intellectual Property Office, the entire contents of which are incorporated herein by reference.

BACKGROUND

Inventive concepts relate to a voltage-controlled delay line used to generate a plurality of clock signals, and more particularly, to a voltage-controlled delay line that stably operates even at the initial stage of power supply and has the same delay value between a plurality of generated clock signals.

A delay-locked loop circuit is used in a synchronous semiconductor memory device to control a time point at which data is output from the synchronous semiconductor device by using an external clock signal. Clock signals having different delay components, that is, multi-phase clock signals, are used to reproduce data written to an optical disk or the like. That is, when an optical disk reproducing apparatus performs tracking on an optical disk, multi-phase clock signals are used to detect a tracking error. Each of the delay-locked loop circuit and the optical disk reproducing apparatus used in the synchronous semiconductor memory device includes a voltage-controlled delay line for generating a plurality of delay clock signals that are obtained by delaying an input clock signal by a predetermined period of time.

SUMMARY

According to an aspect of inventive concepts, there is provided a delay-locked loop circuit including a voltage-controlled delay line configured to generate a plurality of delayed clock signals based on an input clock signal, a lock signal and a voltage control signal, the plurality of delayed clock signals being sequentially delayed from one another to produce an earliest delayed clock signal to a latest delayed clock signal, the voltage-controlled delay line including an anti-jitter delay circuit and a plurality of delay circuits, the anti-jitter delay circuit configured to output the earliest delayed clock signal, and the plurality of delay circuits coupled in series and configured to output a remainder of the plurality of delayed clock signals, a phase frequency detection circuit configured to generate an up signal and a down signal based on the earliest delayed clock signal and the latest delayed clock signal, a filter configured to generate the voltage control signal in response to the up signal and the down signal, and a lock detection circuit configured to generate the lock signal in response to the up signal and the down signal.

According to another aspect of inventive concepts, there is provided a voltage-controlled delay line including a plurality of delay circuits connected in series, an anti-jitter delay circuit configured to generate a reference delay signal based on an input clock signal and an operation control signal, a first delay circuit configured to generate a first delay signal of the reference delay signal, a second delay circuit configured to generate a second delay signal of the first delay signal, and an $N^{th}$ delay circuit configured to generate an $N^{th}$ delay signal of an $N-1^{th}$ (N is a natural number greater than 3) delay signal, wherein the anti-jitter delay circuit includes the same delay as the first delay circuit, the second delay circuit, and the $N^{th}$ delay circuit if the operation control signal is activated, and is configured to operate as a buffer if the operation control signal is inactivated.

According to another aspect of inventive concepts, there is provided a multi-phase clock generator for generating a plurality of clock signals obtained by sequentially delaying an input clock signal, which is externally applied, respectively, by predetermined periods of time, the multi-phase clock generator including a first delay circuit which generates a first delay signal obtained by delaying the input clock signal by a predetermined period of time in response to an operation control signal, a second delay circuit which generates a second delay signal obtained by delaying the first delay signal by a predetermined period of time, and a $N^{th}$ delay circuit which generates an $N^{th}$ delay signal obtained by delaying an $(N-1)^{th}$ delay signal wherein the first delay circuit operates as a delay block having the same delay characteristics as those of the second delay circuit and the $N^{th}$ delay circuit when the operation control signal is activated, and operates as a buffer when the operation control signal is inactivated.

In another aspect of inventive concepts, a delay system includes an anti-jitter delay circuit configured to receive an input clock signal, delay the input clock signal and output a reference clock signal, and a plurality of delay circuits configured to receive the reference clock signal and output a plurality of delayed signals based on first and second bias signals, a delay between the input clock signal and the reference clock signal being a multiple of a delay between a first delayed signal and a second delayed signal.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Figure 1:
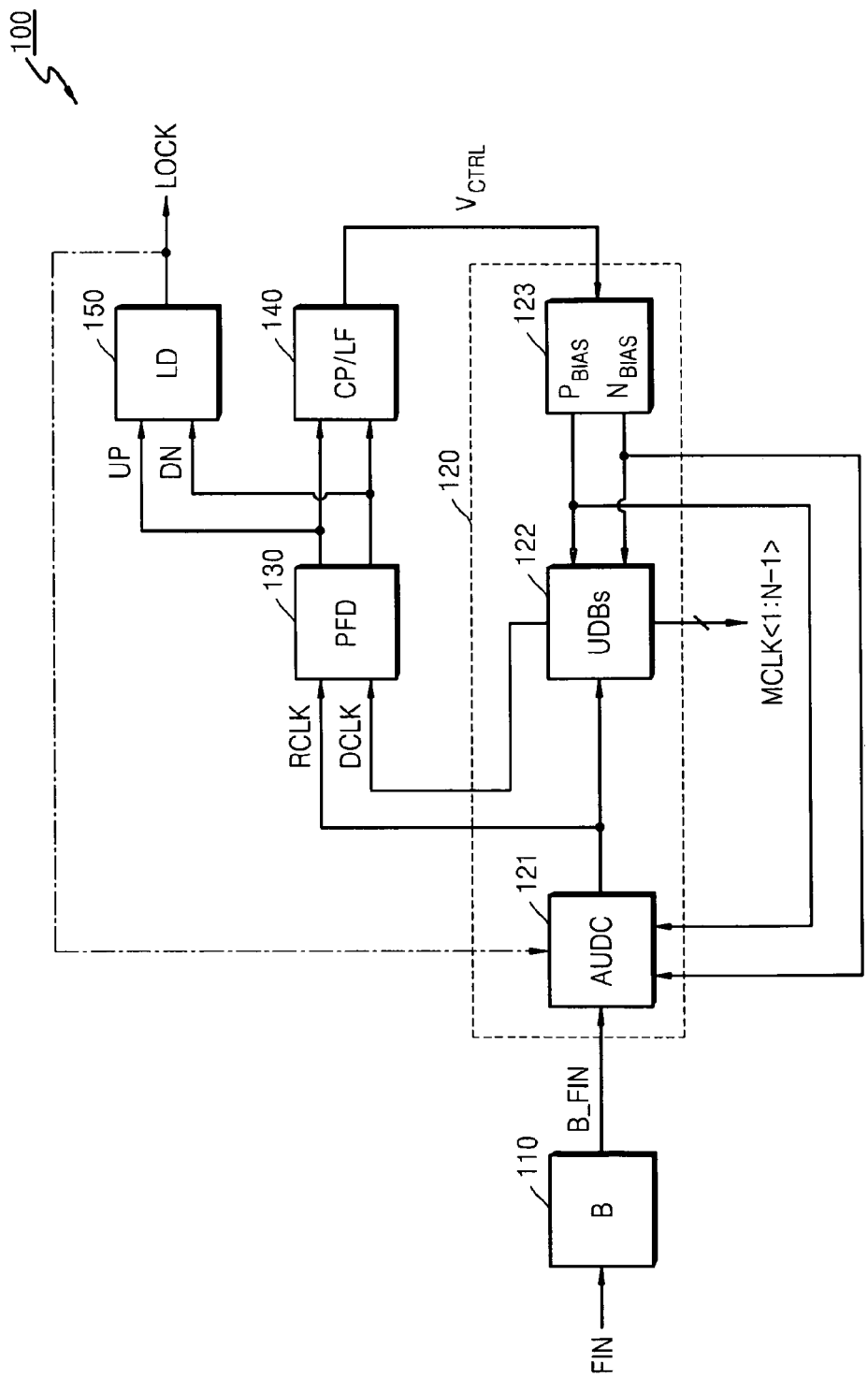
FIG. 1 illustrates a block diagram of a delay-locked loop circuit according to an example embodiment.

The attached drawings for illustrating example embodiments of inventive concepts are referred to in order to gain a sufficient understanding of inventive concepts, the merits thereof, and objectives accomplished by the implementation of inventive concepts.

Hereinafter, inventive concepts will be described in detail by explaining example embodiments with reference to the attached drawings. In the drawings, lengths and sizes of layers and regions may be exaggerated for clarity. Like reference numerals in the drawings denote like elements.

It will be understood that, although the terms first, second, third etc. may be used herein to describe various elements, these elements should not be limited by these terms. These terms are used to distinguish one element from another. Thus, a first element discussed below could be termed a second element without departing from the teachings of inventive concepts.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises", "comprising", "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a block diagram of a delay-locked loop circuit 100 according to an example embodiment of inventive concepts.

Referring to FIG. 1, the delay-locked loop circuit 100 includes a buffer circuit 110, a voltage-controlled delay line 120, a phase frequency detection circuit 130, a charge pump/loop filter 140, and a lock detection circuit 150.

The voltage-controlled delay line 120 operates in response to a voltage control signal $V_{CTRL}$, and generates a plurality of clock signals RCLK (reference delay signal), MCLK<1:N−1>, and DCLK obtained by sequentially delaying an input clock signal B_FIN respectively by predetermined periods of time by using a plurality of unit delay circuits (see FIG. 2) that are connected in series. Here, N is a natural number. The voltage-controlled delay line 120 includes an anti-jitter delay circuit 121, a unit delay block 122, and a bias generator 123. Here, the clock signal RCLK with an earliest phase is an output signal of the anti-jitter delay circuit 121 that is a first delay block from among the plurality of unit delay circuits that are connected in series, and the clock signal DCLK with a last phase is an output signal of a last unit delay unit among the plurality of unit delay circuits that are connected in series. This will be explained further with reference to FIG. 2. The bias generator 123 generates a first bias $P_{BIAS}$ and a second bias $N_{BIAS}$ by using the voltage control signal $V_{CTRL}$. The first and second biases $P_{BIAS}$ and $N_{BIAS}$ are used in the anti-jitter delay circuit 121 and the plurality of unit delay circuits of the unit delay block 122.

The phase frequency detection circuit 130 generates an up signal UP and a down signal DN by using the clock signal RCLK with the earliest phase and the clock signal DCLK with the last phase from among the plurality of clock signals RCLK, MCLK<1:N−1>, and DCLK. The charge pump/loop filter 140 determines a voltage level of the voltage control signal $V_{CTRL}$ generated in response to the up signal UP and the down signal DN. The lock detection circuit 150 generates a lock signal LOCK in response to the up signal UP and the down signal DN. The lock signal LOCK, which is generally used outside the delay-locked loop circuit 100, includes information about whether frequencies and phases of the clock signals output from the delay-locked loop circuit 100 are locked. Inventive concepts prevent an unstable state by using the lock signal LOCK, which will be explained later.

Figure 2:
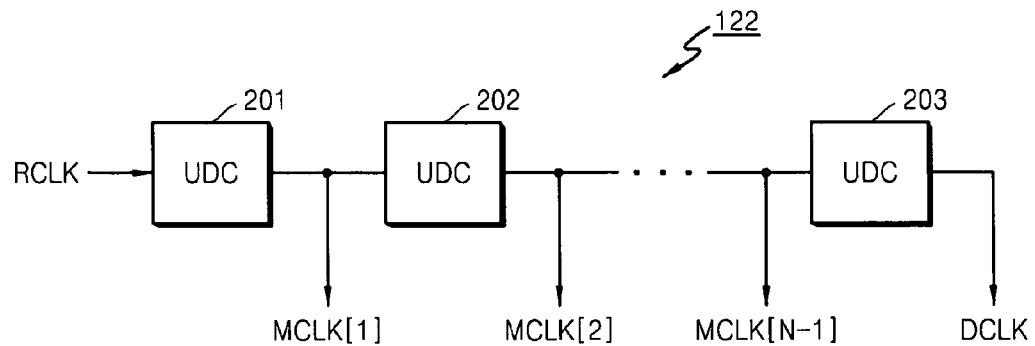
FIG. 2 illustrates a block diagram of a unit delay block constituting a voltage-controlled delay line of the delay-locked loop circuit of FIG. 1.

FIG. 2 illustrates a block diagram of the unit delay block 122 constituting the voltage-controlled delay line 120 of the delay-locked loop circuit 100 illustrated in FIG. 1.

Referring to FIG. 2, the unit delay block 122 includes a plurality of unit delay circuits, namely, first, second, and third delay circuits 201, 202, and 203, that are connected in series.

The first unit delay circuit 201 generates a first delay signal MCLK[1] obtained by delaying the delay clock signal RCLK output from the anti-jitter delay circuit 121 by a predetermined period of time. The second unit delay circuit 202 generates a second delay signal MCLK[2] obtained by delaying the first delay signal MCLK[1] output from the first unit delay circuit 201 by a predetermined period of time. The $N^{th}$ unit delay circuit 203 generates the final clock signal DCLK by delaying an $(N-1)^{th}$ delay signal MCLK[N−1] by a predetermined period of time.

Figure 3:
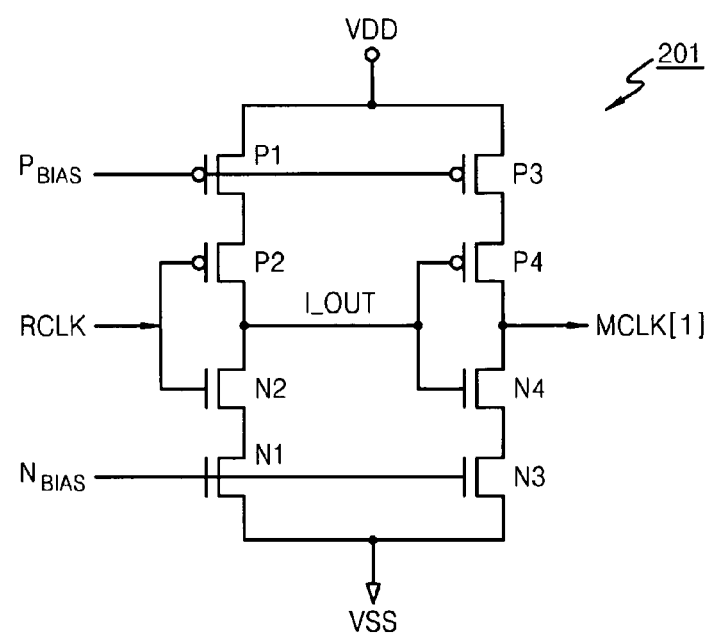
FIG. 3 illustrates a circuit diagram of a first unit delay circuit of the unit delay block of FIG. 2.

FIG. 3 is a circuit diagram of the first unit delay circuit 201 of the unit delay block 122 illustrated in FIG. 2.

Referring to FIG. 3, the first unit delay circuit 201 includes eight transistors, namely, first through fourth p-type transistors P1, P2, P3, and P4, and first through fourth n-type transistors N1, N2, N3, and N4.

For convenience of explanation, the first unit delay circuit 201 illustrated in FIG. 2 will be explained. However, the same explanation applies to the other unit delay circuits. In other words, the other unit delay circuits have the same circuit configuration as that of the first unit delay circuit 201.

The first P-type transistor P1 has one terminal connected to a first power supply voltage VDD and a gate to which the first bias $P_{BIAS}$ is applied. The second P-type transistor P2 has one terminal connected to another terminal of the first P-type transistor P1 and a gate to which an input signal (the clock signal RCLK for the unit delay circuit 201) is applied. The first N-type transistor N1 has one terminal connected to a second power supply voltage VSS and a gate to which the second bias $N_{BIAS}$ is applied. The second N-type transistor N2 has one terminal connected to another terminal of the first N-type transistor N1, a gate to which the input signal is applied, and another terminal connected to another terminal of the second P-type transistor P2 to generate an internal output signal I_OUT.

The third P-type transistor P3 has one terminal connected to the first power supply voltage VDD and a gate to which the first bias $P_{BIAS}$ is applied. The fourth P-type transistor P4 has one terminal connected to another terminal of the third P-type transistor P3, a gate to which the internal output signal I_OUT is applied, and another terminal for generating the delay signal MCLK[1]. The third N-type transistor N3 has one terminal connected to the second power supply voltage VSS and a gate to which the second bias $N_{BIAS}$ is applied. The fourth N-type transistor N4 has one terminal connected to another terminal of the third N-type transistor N3, a gate to which the internal output signal I_OUT is applied, and another terminal connected to another terminal of the fourth P-type transistor P4.

The four transistors P1, P2, N1, and N2 on the left side and the four transistors P3, P4, N3, and N4 on the right side of FIG. 3, respectively, function as inverters having delay characteristics determined by the first bias $P_{BIAS}$ and the second bias $N_{BIAS}$. That is, the first unit delay circuit 201 acts as a buffer circuit with two inverters that are connected in series. Delay characteristics of the first unit delay circuit 201 are determined according to voltage levels of the first bias $P_{BIAS}$ and the second bias $N_{BIAS}$ and sizes of the four transistors P1, P3, N1, and N3 operated by the first bias $P_{BIAS}$ and the second bias $N_{BIAS}$. For example, as a voltage level of the first bias $P_{BIAS}$ becomes more similar to a voltage level of the second power supply voltage VSS and a voltage level of the second bias $N_{BIAS}$ becomes more similar to a voltage level of the first power supply voltage VDD, a delay time decreases.

If the lock signal LOCK is not used by the voltage-controlled delay line 120, the anti-jitter delay circuit 121 is the same as the first unit delay circuit 201 illustrated in FIG. 3.

However, if the lock signal LOCK is used by the voltage-controlled delay line 120, internal circuits of the anti-jitter delay circuit 121 and each of the first through third unit delay circuits 201, 202, and 203 illustrated in FIG. 2 are different from each other.

Figure 4:
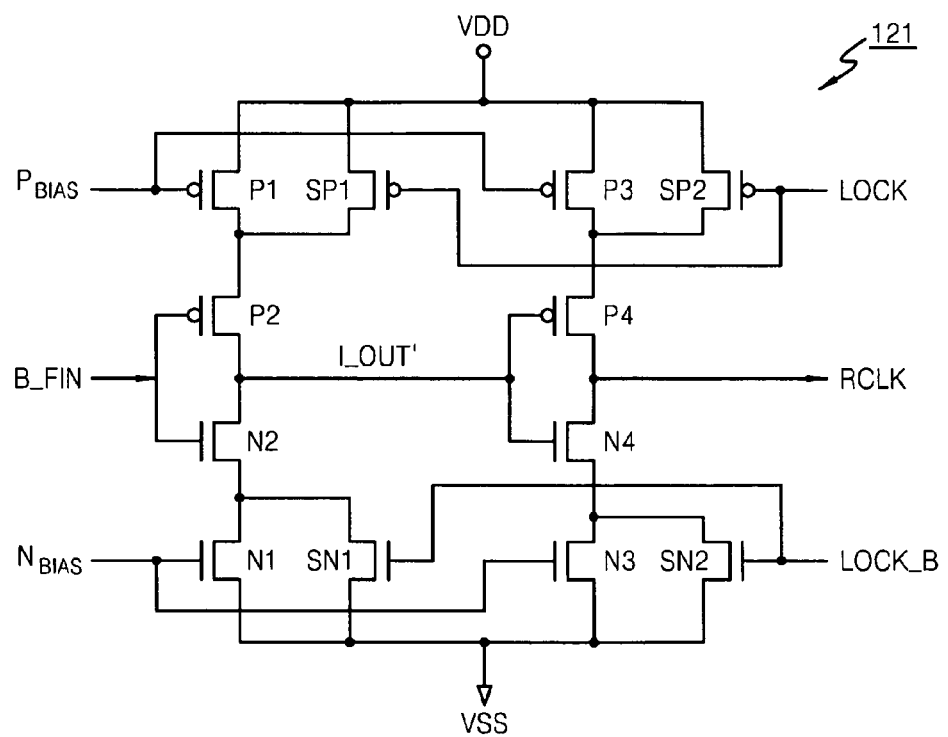
FIG. 4 illustrates a circuit diagram of an anti-jitter delay circuit when an operation of the voltage-controlled delay line is determined by a lock signal according to an example embodiment.

FIG. 4 is a circuit diagram of the anti-jitter delay circuit 121 when an operation of the voltage-controlled delay line 120 is determined by the lock signal LOCK.

Referring to FIG. 4, the anti-jitter delay circuit 121 includes the eight transistors, namely, first through fourth P-type transistors P1, P2, P3, and P4, first through fourth N-type transistors N1, N2, N3, and N4, and further includes four transistors, namely, first and second P-type switch transistors SP1 and SP2, and first and second N-type switch transistors SN1 and SN2. The fourth P-type transistor P4 has one terminal connected to another terminal of the third P-type transistor P3 and a gate to which an internal output signal I_OUT' is applied.

The first P-type switch transistor SP1 has two terminals connected in parallel to the first P-type transistor P1 and a gate to which the lock signal LOCK is applied. The first N-type switch transistor SN1 has two terminals connected in parallel to the first N-type transistor N1 and a gate to which an inverted lock signal LOCK_B with a phase opposite to that of the lock signal LOCK is applied. The second P-type switch transistor SP2 has two terminals connected in parallel to the third P-type transistor P3 and a gate to which the lock signal LOCK is applied. The second N-type switch transistor SN2 has two terminals connected in parallel to the third N-type transistor N3 and a gate to which the inverted lock signal LOCK_B is applied.

As described above, delay characteristics of the first through third unit delay circuits 201 to 203 illustrated in FIG. 3 may be adjusted by varying voltage levels of the first bias $P_{BIAS}$ and the second bias $N_{BIAS}$. However, since the purpose of a unit delay circuit is to generate a delay signal by delaying an input signal by a predetermined period of time, it is determined at the design stage that a voltage level of the first bias $P_{BIAS}$ is slightly lower than a voltage level of the first power supply voltage VDD and a voltage level of the second bias $N_{BIAS}$ is slightly higher than a voltage level of the second power supply voltage VSS.

The lock signal LOCK has two logic values, and a voltage level corresponding to a logic high signal is the same as a voltage level of the first power supply voltage VDD and a voltage level corresponding to a logic low signal is the same as a voltage level of the second power supply voltage VSS.

Accordingly, there is a considerable difference between voltage levels of signals applied to the gates of the first P-type switch transistor SP1 and the first P-type transistor P1, which are connected in parallel to each other. Since there is a great difference between voltage levels of the lock signal LOCK and the first bias $P_{BIAS}$, when it is assumed that sizes of the first P-type transistor P1 and the first P-type switch transistor SP1 are the same, the amount of current flowing from the first power supply voltage VDD through the first P-type switch transistor SP1 to the second P-type transistor P2 is greater than the amount of current flowing from the first power supply voltage VDD through the first P-type transistor P1 to the second P-type transistor P2.

Likewise, there is a considerable difference between voltage levels of signals applied to the gates of the first N-type transistor N1 and the first N-type switch transistor SN1. Since there is a great difference between voltage levels of the lock signal LOCK and the second bias $N_{BIAS}$, when it is assumed that sizes of the first N-type transistor N1 and the first N-type switch transistor SN1 are the same, the amount of current sunk from the second N-type transistor N2 through the first N-type switch transistor SN1 to the second power supply voltage VSS is greater than the amount of current sunk from the second N-type transistor N2 through the first N-type transistor N1 to the second power supply voltage VSS.

Since the amount of current supplied from the first power supply voltage VDD and sunk to the second power supply voltage VSS is relatively small, when the first P-type transistor P1 and the first N-type transistor N1 are turned on, the anti-jitter delay circuit 121 operates as a delay circuit having strong delay characteristics. Meanwhile, since the amount of current supplied from the first power supply voltage VDD and sunk to the second power supply voltage VSS is relatively large, when the first P-type switch transistor SP1 and the first N-type switch transistor SN1 are turned on, the anti-jitter delay circuit 121 operates as an inverter of an input signal.

In other words, the anti-jitter delay circuit 121 functions as a delay circuit or a buffer circuit according to a logic value of the lock signal LOCK. That is, the anti-jitter delay circuit 121 operates as a delay circuit when the two switch transistors, that is, the first P-type switch transistor SP1 and the first N-type switch transistor SN1, are turned off due to a logic value of the logic signal LOCK, and operates as a buffer circuit with two inverters that are connected in series when the first P-type and N-type switch transistors SP1 and SN1 are turned on.

As described above, when sizes of the first P-type switch transistor SP1 and the first P-type transistor P1 are the same and sizes of the first N-type switch transistor SN1 and the first N-type transistor N1 are the same, the anti-jitter delay circuit 121 may selectively function as a buffer circuit or a delay circuit by allowing, at the design stage, voltage levels corresponding to logic values of the lock signal LOCK to be the same as voltage levels of the first power supply voltage VDD and the second power supply voltage VSS.

If voltage levels corresponding to logic values of the lock signal LOCK are higher or lower than voltage levels of the first power supply voltage VDD and the second power supply voltage VSS, the same effect may be obtained by allowing, at the design stage, sizes of the first P-type switch transistor SP1 and the first N-type switch transistor SN1 to be larger than sizes of the first P-type transistor P1 and the first N-type transistor N1.

The reason why an operation of the anti-jitter delay circuit 121 is adjusted according to a logic value of the lock signal LOCK will now be explained. Voltage levels of the first and second biases $P_{BIAS}$ and $N_{BIAS}$ generated when a voltage level of the voltage control signal $V_{CTRL}$ may not be stable enough to reach predetermined target values. In this case, in order to prevent a wrong operation of the delay circuit, the operation of the anti-jitter delay circuit 121 is adjusted according to the logic value of the lock signal LOCK. That is, when it is determined that a voltage level of the voltage control signal $V_{CTRL}$ is not stable, the anti-jitter delay circuit 121 may operate as a buffer by adjusting a logic value of the lock signal LOCK, and when it is determined that a voltage level of the voltage control signal $V_{CTRL}$ is stable, the anti-jitter delay circuit 121 may operate as a general delay circuit by adjusting a logic value of the lock signal LOCK.

Figure 5:
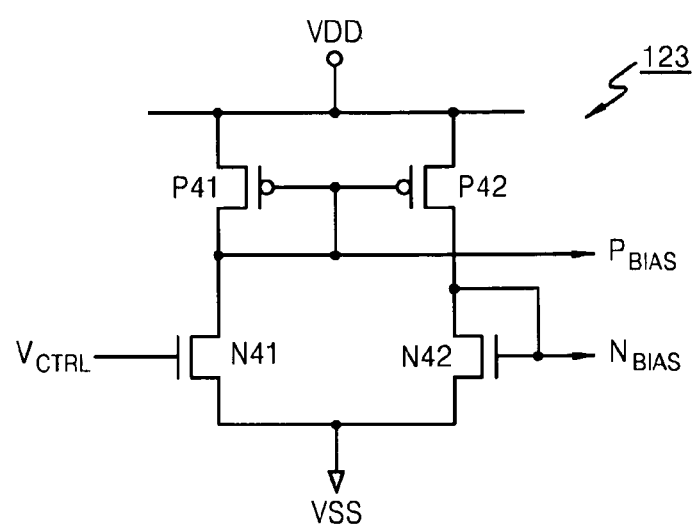
FIG. 5 illustrates a circuit diagram of a bias generator of the delay-locked loop circuit of FIG. 1.

FIG. 5 illustrates a circuit diagram of the bias generator 123 of the delay-locked loop circuit 100 illustrated in FIG. 1. The bias generator 123 includes first and second P-type transistors P41 and P42 and first and second N-type transistors N41 and N42.

Since a configuration and an operation of the bias generator 123 illustrated in FIG. 5 are generally known, an explanation thereof will not be given.

Figure 6:
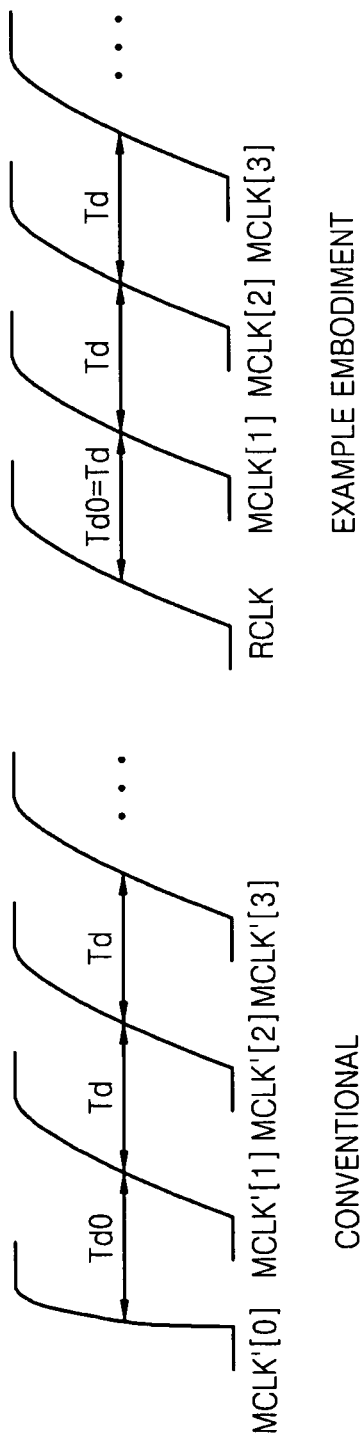
FIG. 6 illustrates a timing diagram according to an example embodiment of inventive concepts.

FIG. 6 illustrates a timing diagram according to an example embodiment of inventive concepts.

Referring to a conventional art on the left side of FIG. 6, shift characteristics between a clock signal MCLK'[0] that is externally applied and output signals MCLK'[1]~MCLK'[3] of a plurality of delay circuits which are obtained by delaying a signal respectively by predetermined periods of time are different. That is, since the clock signal MCLK'[0] is output from an inverter (not shown) having a constant driving performance, a rising edge of the clock signal MCLK'[0] is sharp. However, a rising edge of each of the output signals MCLK'[1]~MCLK [3] output from the delay circuits is relatively smooth. Since the purpose of a delay circuit is to delay an input signal by a predetermined period of time, it is natural that the rising edge of each of the output signals MCLK'[1]~MCLK [3] is smooth. When comparing the clock signal MCLK'[0] with the output signals MCLK'[1]~MCLK [3] that are delay signals in a system, since delay characteristics of the clock signal MCLK'[0] and the output signals MCLK'[1]~MCLK [3] are different from each other, if a circuit is designed assuming that the delay characteristics of the clock signal MCLK'[0] and the output signals MCLK'[1]~MCLK [3] are the same, an operational error may occur.

Referring to the inventive concept on the right side of FIG. 6, delay characteristics of the clock signal RCLK and the output signals MCLK[1]~MCLK[3] are the same. Accordingly, when the RCLK is compared with any of the delay signals MCLK[1]~MCLK[3], mathematical linearity may be achieved.

Figure 7:
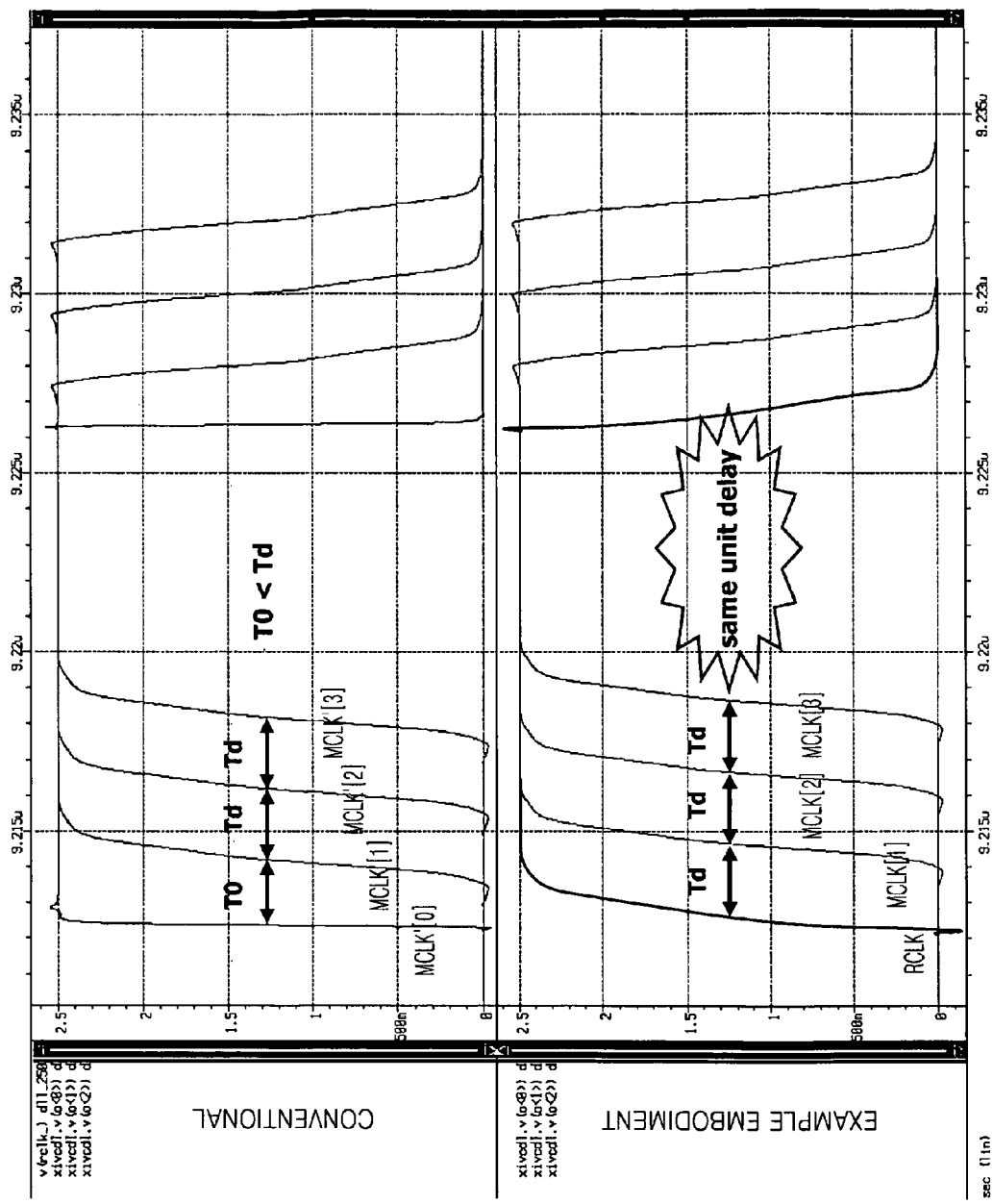
FIG. 7 illustrates a comparison of output signals of delay circuits according to an example embodiment.

FIG. 7 illustrates a comparison of output signals of delay circuits.

Referring to a conventional apparatus on the upper side of FIG. 7, a time difference T0 between the first signal MCLK'[0] and the second signal MCLK'[1] is different from a time difference Td between the second signal MCLK'[1] and the third signal MCLK'[2]. However, a time difference Td between the second signal MCLK'[ ]1 and the third signal MCLK'[2] is the same as a time difference Td between the third signal MCLK'[2] and a fourth signal MCLK'[3]. The time difference T0 between the first signal MCLK'[0] and the second signal MCLK'[1] is less than the time difference Td between the second signal MCLK'[1] and the third signal MCLK'[2].

Referring to an apparatus according to an example embodiment of inventive concepts on the lower side of FIG. 7, time differences Td between all of adjacent signals are the same.

Figure 8:
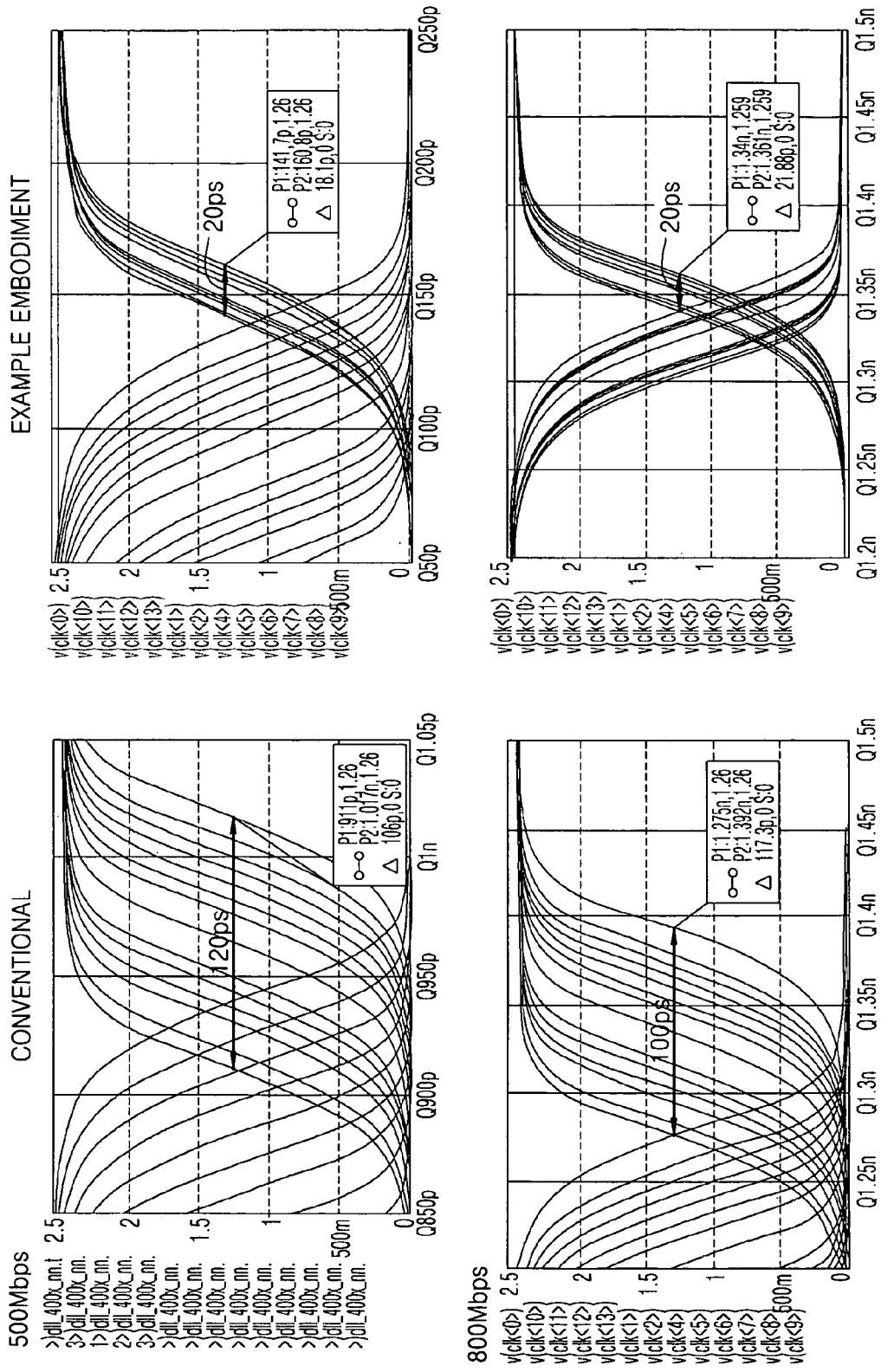
FIG. 8 illustrates results of a signal adjustment locked in a delay-locked loop circuit According to an example embodiment.

FIG. 8 illustrates results of a signal adjustment locked in a delay-locked loop circuit.

Referring to a conventional art on the left side of FIG. 8, an accurate eye pattern may not be obtained, whereas referring to an example embodiment of inventive concepts on the right side of FIG. 8, an accurate eye pattern may be obtained.

Figure 9:
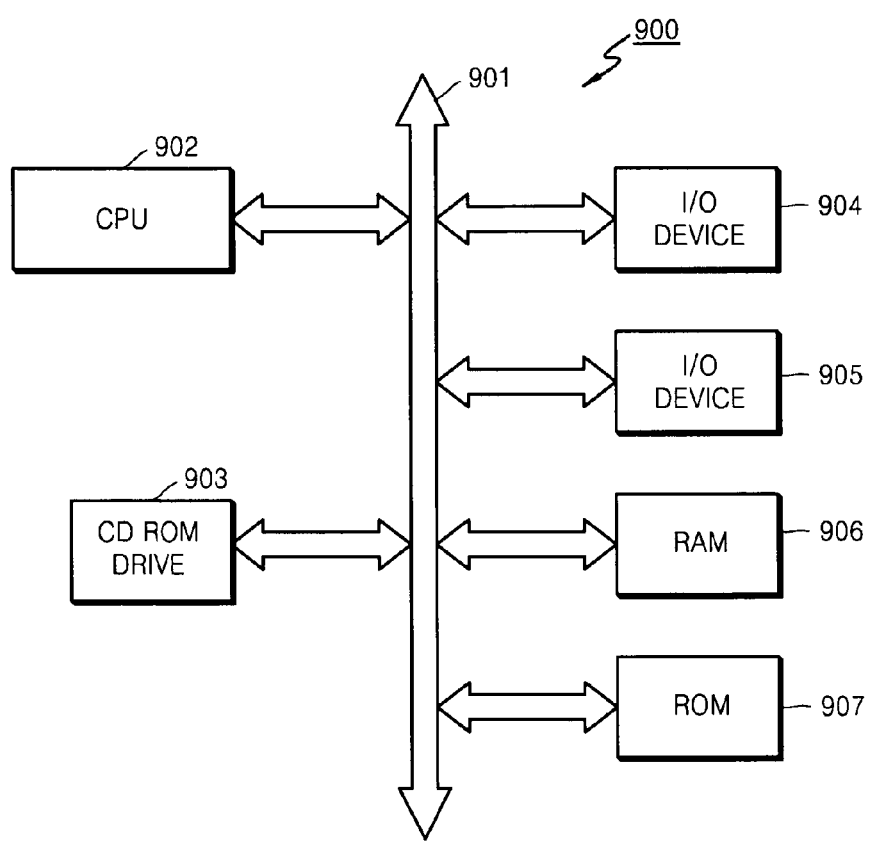
FIG. 9 illustrates a processor-based system using a multi-phase clock generator, according to an example embodiment.

FIG. 9 illustrates a processor-based system 900 using a multi-phase clock generator, according to an example embodiment of inventive concepts.

The system 900 includes a central processing unit (CPU) 902 that communicates with a random-access memory (RAM) 906 and input/output (I/O) devices 904 and 905 via a bus 901, a compact disk read-only memory (CD-ROM) driver 903 that communicates with the CPU 902 via the bus 901, and a read-only memory (ROM) 907.

Although not shown in FIG. 9, the multi-phase clock generator may be installed in the RAM 906 or the CPU 902.

While inventive concepts have been particularly shown and described with reference to example embodiments thereof using specific terms, example embodiments and terms have been used to explain inventive concepts and should not be construed as limiting the scope of inventive concepts defined by the claims. Accordingly, it will be understood by those of ordinary skill in the art that various changes in form and details may be made therein without departing from the spirit and scope of inventive concepts as defined by the following claims.

What is claimed is:

1. A delay-locked loop circuit comprising:
a voltage-controlled delay line configured to generate a plurality of delayed clock signals based on an input clock signal, a lock signal and a voltage control signal, the plurality of delayed clock signals being sequentially delayed from one another to produce an earliest delayed clock signal to a latest delayed clock signal, the voltage-controlled delay line including an anti-jitter delay circuit and a plurality of delay circuits, the anti-jitter delay circuit configured to output the earliest delayed clock signal, and the plurality of delay circuits coupled in series and configured to output a remainder of the plurality of delayed clock signals;
a phase frequency detection circuit configured to generate an up signal and a down signal based on the earliest delayed clock signal and the latest delayed clock signal;
a filter configured to generate the voltage control signal in response to the up signal and the down signal; and
a lock detection circuit configured to generate the lock signal in response to the up signal and the down signal.

2. The delay-locked loop circuit of claim 1, wherein the anti-jitter delay circuit and each of the delay circuits have the same delay time between an input signal and an output signal.

3. The delay-locked loop circuit of claim 1, wherein the voltage-controlled delay line includes a bias generator configured to generate a first bias and a second bias based on the voltage control signal.

4. The delay-locked loop circuit of claim 3, wherein the anti-jitter delay circuit and each of the delay circuits comprises:

a first P-type transistor having one terminal connected to a first power supply voltage and a gate, the gate of the first P-type transistor configured to receive the first bias;

a second P-type transistor having one terminal connected to another terminal of the first P-type transistor and a gate, the gate of the second P-type transistor configured to receive an input signal;

a first N-type transistor having one terminal connected to a second power supply voltage and a gate, the gate of the first N-type transistor configured to receive the second bias;

a second N-type transistor having one terminal connected to another terminal of the first N-type transistor, a gate configured to receive the input signal, and another terminal connected to another terminal of the second P-type transistor configured to generate an internal output signal;

a third P-type transistor having one terminal connected to the first power supply voltage and a gate, the gate of the third P-type transistor configured to receive the first bias;

a fourth P-type transistor having one terminal connected to another terminal of the third P-type transistor, a gate configured to receive the internal output signal, and another terminal configured to generate one of the delayed clock signals;

a third N-type transistor having one terminal connected to the second power supply voltage and a gate, the gate of the third N-type transistor configured to receive the second bias; and a fourth N-type transistor having one terminal connected to another terminal of the third N-type transistor, a gate configured to receive the internal output signal, and another terminal connected to the another terminal of the fourth P-type transistor.

5. The delay-locked loop circuit of claim 4, wherein the anti-jitter delay circuit further comprises:

a first P-type switch transistor having two terminals connected in parallel to the first P-type transistor and a gate, the gate of the first P-type switch transistor configured to receive the lock signal;

a first N-type switch transistor having two terminals connected in parallel to the first N-type transistor and a gate, the gate of the first N-type switch transistor configured to receive an inverted lock signal with a phase opposite to a phase of the lock signal;

a second P-type switch transistor having two terminals connected in parallel to the third P-type transistor and a gate, the gate of the second P-type switch transistor configured to receive the lock signal; and a second N-type switch transistor having two terminals connected in parallel to the third N-type transistor and a gate, the gate of the second N-type switch transistor configured to receive the inverted lock signal.

6. The delay-locked loop circuit of claim 5, wherein a voltage level corresponding to one logic value from among two logic values of the lock signal is higher than a voltage level of the first bias, and a voltage level corresponding to a remaining logic value of the lock signal is lower than a voltage level of the second bias.

7. The delay-locked loop circuit of claim 5, wherein two voltage levels corresponding to two logic values of the lock signal are respectively the same as voltage levels of the first bias and the second bias, wherein current driving performances of the first P-type switch transistor, the first N-type switch transistor, the second P-type switch transistor, and the second N-type switch transistor are greater than current driving performances of the first P-type transistor, the first N-type transistor, the second P-type transistor, and the second N-type transistor which are respectively connected in parallel to the first P-type switch transistor, the first N-type switch transistor, the second P-type switch transistor, and the second N-type switch transistor.

8. The delay-locked loop circuit of claim 1, further comprising:

a buffer circuit configured to buffer an external reference clock signal and generate the input clock signal based on the buffered external reference clock signal.

9. A voltage-controlled delay line comprising:

a plurality of delay circuits connected in series;

an anti-jitter delay circuit configured to generate a reference delay signal based, on an input clock signal and an operation control signal;

a first delay circuit configured to generate a first delay signal of the reference delay signal;

a second delay circuit configured to generate a second delay signal of the first delay signal;

an $N^{th}$ delay circuit configured to generate an $N^{th}$ delay signal of an $N-1^{th}$ (N is a natural number greater than 3) delay signal; and a bias generator configured to generate a first bias and a second bias based on a voltage control signal, wherein the anti jitter delay circuit includes a same delay as the first delay circuit, the second delay circuit, and the $N^{th}$ delay circuit if the operation control signal is activated and each of the anti-jitter delay circuit, the first delay circuit, the second delay circuit, and the $N^{th}$ delay circuit includes, a first P-type transistor having one terminal connected to a first power supply voltage and a gate, the gate of the first P-type transistor configured to receive the first bias, a second P-type transistor having one terminal connected to another terminal of the first P-type transistor and a gate, the gate of the second P-type transistor configured to receive the input signal, a first N-type transistor having one terminal connected to a second power supply voltage and a gate, the gate of the first N-type transistor configured to receive the second bias, a second N-type transistor having one terminal connected to another terminal of the first N-type transistor, a gate configured to receive the input signal, and another terminal connected to another terminal of the second P-type transistor to generate an internal output signal, a third P-type transistor having one terminal connected to the first power supply voltage and a gate, the gate of the third P-type transistor configured to receive the first bias, a fourth P-type transistor having one terminal connected to another terminal of the third P-type transistor, a gate connected to a common terminal of the second P-type transistor and the second N-type transistor, and another terminal configured to generate one of the delayed clock signals, a third N-type transistor having one terminal connected to the second power supply voltage and a gate, the gate of the third N-type transistor configured to receive the second bias, and a fourth N-type transistor having one terminal connected to another terminal of the third N-type transistor, a gate connected to a common terminal of the second P-type transistor and the second N-type transistor, and another terminal connected to the another terminal of the fourth P-type transistor.

10. The voltage-controlled delay line of claim 9, wherein the anti-jitter delay circuit is configured to operate as a buffer if the operation control signal is not activated.

11. The voltage-controlled delay line of claim 9, wherein the anti-jitter delay circuit further comprises:
a first P-type switch transistor connected in parallel to the first P-type transistor and a gate, the gate of the first P-type switch transistor configured to receive the operation control signal;
a first N-type switch transistor connected in parallel to the first N-type transistor and a gate, the gate of the first N-type switch transistor configured to receive an inverted operation control signal with a phase opposite to that of the operation control signal;
a second P-type switch transistor connected in parallel to the third P-type transistor and a gate, the gate of the second P-type switch transistor configured to receive the operation control signal; and
a second N-type switch transistor connected in parallel to the third N-type transistor and a gate, the gate of the second N-type switch transistor configured to receive the inverted operation control signal.

12. The voltage-controlled delay line of claim 11, wherein a voltage level corresponding to one logic value from among two logic values of the operation control signal is higher than a voltage level of the first bias, and a voltage level corresponding to the remaining logic value of the operation control signal is lower than a voltage level of the second bias.

13. The voltage-controlled delay line of claim 11, wherein two voltage levels corresponding to two logic values of the operation control signal are respectively the same as voltage levels of the first bias and the second bias,
wherein current driving performances of the first P-type switch transistor SP1, the first N-type switch transistor, the second P-type switch transistor, and the second N-type switch transistor are greater than current driving performances of the first P-type transistor, the first N-type transistor, the second P-type transistor, and the second N-type transistor which are respectively connected in parallel to the first P-type switch transistor, the first N-type switch transistor, the second P-type switch transistor, and the second N-type switch transistor.

14. A delay system comprising:
an anti-jitter delay circuit configured to receive an input clock signal, delay the input clock signal and output a reference clock signal; and
a plurality of delay circuits configured to receive the reference clock signal and output first to Nth delayed signals based on first and second bias signals, a delay between the input clock signal and the reference clock signal being a multiple of a delay between a first delayed signal and a second delayed signal, wherein N is greater than or equal to two, wherein at least one of the plurality of delay circuits includes,
a first inverter configured to receive the first and second bias signals and an input clock signal, the first inverter configured to output an internal output signal based on the first and second bias signals and the input clock signal, the first inverter includes,
a first transistor coupled to a first power supply,
a second transistor coupled to the first transistor and a fourth transistor,
a third transistor coupled to a fourth transistor and a second power supply, and
the fourth transistor coupled to the second transistor and the third transistor, a common terminal of the second transistor and the fourth transistor being configured to output the internal output signal, and
a second inverter configured to receive the first and second bias signals and the internal output signal, the second inverter configured to output one of the plurality of delayed signals based on the first and second bias signals and the internal output signal.

15. The delay system of claim 14, wherein the delay between the input clock signal and the reference clock signal and the delay between the first delayed signal and the second delayed signal are the same.

16. The delay system of claim 14, wherein the second inverter includes,
a fifth transistor coupled to the first power supply,
a sixth transistor coupled to the fifth transistor and an eighth transistor,
a seventh transistor coupled to the eighth transistor and the second power supply, and
the eighth transistor coupled to the sixth transistor and the eighth transistor, a common terminal of the eighth transistor and the sixth transistor being configured to output the one of the plurality of delayed signals.

* * * * *